United States Patent [19]

Hoffman et al.

[11] Patent Number: 4,882,022
[45] Date of Patent: Nov. 21, 1989

[54] PROCESS AND APPARATUS FOR SPUTTER COATING A GOLD ALLOY ONTO A SUBSTRATE

[75] Inventors: Dieter Hoffman, Bruchköbel; Wolf-Dieter Münz; G. A. Horst Siewert, both of Freigericht; Horst Dietrich, Biebergemünd, all of Fed. Rep. of Germany

[73] Assignees: Leybold Aktiengesellschaft; Demetron Gesellschaft Fuer Elektronik-Werkstoffe mbH, both of Hanau, Fed. Rep. of Germany

[21] Appl. No.: 230,235

[22] Filed: Aug. 9, 1988

Related U.S. Application Data

[62] Division of Ser. No. 921,235, Oct. 20, 1986, Pat. No. 4,808,373.

[30] Foreign Application Priority Data

Sep. 19, 1986 [DE] Fed. Rep. of Germany ....... 3631830

[51] Int. Cl.[4] .............................................. C23C 14/34
[52] U.S. Cl. ................................. 204/192.15; 204/298
[58] Field of Search .................... 204/192.15, 192.16, 204/192.17, 298 R, 298 TC, 192.12, 298 TS; 420/507, 508, 512

[56] References Cited

U.S. PATENT DOCUMENTS

| | | | |
|---|---|---|---|
| 1,577,431 | 10/1925 | Davignon | 420/507 |
| 3,616,406 | 11/1969 | Turner | 204/192.15 X |
| 3,702,290 | 11/1972 | Yu et al. | 204/192.15 X |
| 4,619,865 | 10/1986 | Keem et al. | 204/192.15 X |

Primary Examiner—Nam X. Nguyen
Attorney, Agent, or Firm—Felfe & Lynch

[57] ABSTRACT

A process using a multiple-substance alloy having a gold content most preferably in the range of 94 to 98 percent by weight as a target in a cathode sputtering apparatus is disclosed. The alloy further contains non-gold elements of aluminum, copper and preferably an element of the group of Co, Ni, Ga, Ti, In, Cd, Sn, Fe and Pd.

12 Claims, No Drawings

PROCESS AND APPARATUS FOR SPUTTER COATING A GOLD ALLOY ONTO A SUBSTRATE

This is a divisional of prior application Ser. No. 921,235, filed on Oct. 20, 1986, now U.S. Pat. No. 4,808,373, issued Feb. 28, 1989.

BACKGROUND OF THE INVENTION

The invention relates to a multiple-substance alloy for targets of cathode sputtering apparatus for the sputtering of gold coatings having non-gold alloy contents which have 0.5 to 10 weight-percent aluminum and also have copper.

A multiple-substance alloy of this kind is disclosed in German Federal Patent 31 42 541, to which U.S. patent No. 4,466,940 corresponds, in which the gold content is between 45 and 65 weight-percent with a predominant range between 57.5 and 59.5 weight-percent.

In standard gold colors, which are based on a gold content up to 65 weight-percent, a large amount of non-gold metals is necessarily present, especially copper which serves as a "reddener." The influence of the copper must consequently be counterbalanced by aluminum serving as a "whitener," so that the red content, expressing itself in the CIELAB unit a*, will not be too high. The following CIELAB units are typical of attractive gold alloys:

| Luster/brilliance | $L^* = 85$ to $90$ |
| Redness | $a^* = 0.5$ to $3$ |
| Yellowness | $b^* = 26$ to $30$. |

A gold surface whose CIELAB units are within the ranges stated above, is considered in western Europe as a standard gold color.

The CIELAB units given above are determined by a method of measurement which has become well established in recent years with producers of surface coatings, especially decorative coatings. It is a colorimetric method in which a beam of light from a standardized light source having quite specific spectral properties is directed at the object being measured, and the reflected light in the visible wavelength range is evaluated. The degree of brilliance can also be determined by a mathematical evaluation, such as for example the proportions of red and yellow color which determine the gold color hue. The bases of the method of measurement are described, for example, in R.M. German, M.M. Guzowsky and D.C. Wright in "Journal of Metals," March 1980, pages 20 ssq., and by the same authors in "Gold Bulletin," July 1980, pages 113 ff.

If one attempts to obtain a standard gold color hue defined by the above ranges, with one of the known target alloys, the copper content of the layer is made so high by the sputtering process that, in spite of the high aluminum content then needed for hue balancing, corrosion resistance will no longer be sufficient. Consequently, it is not possible to correctly establish the standard values and at the same time obtain the necessary corrosion resistance. In particular it is impossible to obtain a high luster, expressed in a high $L^*$ value, of at least $L^* = 85$.

DIN Standard 8238 gives gold alloys with units 1N to 4N and declares these units to be standard colors. In the conversion of these old color values to the more recently employed CIELAB units, it is found that the above CIELAB standard values can be obtained only with a silver content in the alloy amounting to between 1 and 10 percent by weight. Such alloys, however, again prove to be not resistant to corrosion or tarnishing.

The invention is therefore addressed to the problem of quantifying the components of a multiple substance alloy of the kind described above such that the above-given ranges of the CIELAB Standard values will be obtained, that the target will have good sputtering properties with regard to a high sputtering rate, a constant coating composition over long periods of sputtering, and repeatable coating properties, and at the same time will lead to good resistance to corrosion.

The solution of the stated problem is accomplished in accordance with the invention, in the multiple-substance alloy specified above, by the fact that the gold content is between 85 and 98 weight-percent, preferably between 90 and 98 weight-percent, and especially preferably between 94 and 97 percent by weight. The aluminum content is preferably between 0.5 and 5 percent by weight.

On account of the markedly higher gold content, advantageous gold layers are obtained having gold hues whose CIELAB values are within the above-stated ranges. The targets in question are distinguished by very good sputtering properties at high sputtering rates, and also the coating composition and the repeatability of the coating properties remains known over a long period of sputtering. It is to be noted that the target material is consumed during the sputtering and that the same sputtering rate cannot be expected of all alloy components, so that usually even an increasing separation is to be expected. Experience, however, has shown that these effects do not occur or do not occur to a marked extent in the alloy composition according to the invention.

The multiple-substance alloy according to the invention also has the advantage that, with the aluminum content which is peculiar to it, not only the required gold hue but also good corrosion resistance and resistance to wear have been achieved. Furthermore, the same target has been used in successive cycles of operation to coat numerous batches without any impairment of the repeatability of the composition of the coating.

The circumstances can also be further improved by adding additional alloy components to the alloys, at least one additional alloy component being present, from a group of the metals Co, Ni, Ga, Ti, In, Cd, Sn, Fe and Pd with a content in each case of 0.1 to 5 weight-percent, the sum of all additional alloy components not exceeding the value of 6 weight-percent.

On account of the additional alloy components the copper content is, of course, further diminished. But in no case is the bottom limit or the top limit of the stated ranges always selected for each of the additional components. The selection of suitable values within the above-stated ranges can be determined by experiment.

EXAMPLES:

In the performance of the experimental examples further explained below, there was a cathode arrangement of a known kind in the interior of a vacuum chamber which was evacuated before the coating process to pressures between $5 \times 10^{-6}$ and $1 \times 10^{-4}$ mbar. The sputtering was performed in a neutral atmosphere with the continuous input of argon as sputtering gas at a pressure between $1 \times 10^{-3}$ and $2 \times 10^{-2}$. The sputtering parameters, current, voltage and substrate temperature, were optimized or regulated in a conventional manner.

The tightly adherent coating of substrates usually requires the application of a thin intermediate coating as an adhesion mediator. Coating with the gold alloy was performed on brass, stainless steel and German silver substrates, using chromium, titanium, NiCr, molybdenum and tungsten adhesion mediators, which proved to be substantially equally effective.

EXAMPLE 1:

From a target with the dimensions 488 ×88 ×6 mm³ and the following composition:

95% Au
1.25% Al
3.75% Cu a sputtering was performed in a cathode sputtering apparatus onto flat stainless steel substrates in a pure argon atmosphere. The coating had the following CIELAB units when measured with a light source C:

$L^* = 87$ $a^* = 1.8$ $b^* = 29.$

The color of this coating corresponded to a gold hue which is to be classed between the Schweizer standards NIHS 03-50 for the color hues 2N18 and 3N18 (according to DIN). The testing of the coating for corrosion by the salt spray test according to DIN 50021 (SS DIN 50021) and by the condensate test in accordance with DIN 50017 (STW 24 DIN 50017) showed the coating to have good corrosion resistance.

EXAMPLE 2:

In a multi-chamber continuous apparatus, two targets of the following composition were fastened to a mirror-symmetrical double cathode arrangement:

95. % Au
3.65% Cu
1.35% Al.

After performing an ion etching process a layer of 1 μm thickness was applied to stainless steel plates. Prior to the etching process these plates were heated at 160° C. The color values measured with the light source C were:

$L^* = 87$ $a^* = 1.1$ $b^* = 28.$

The color of this coating corresponded to the gold hue 2N18 in accordance with DIN 8238. In corrosion testing, however, the coating showed a decided improvement over DIN standard gold alloys containing silver in the thioacetamide corrosion test which is required of high-quality gold alloy coatings on watchcases and wristwatch bands.

All percentages referred to above are percentages by weight.

We claim:

1. A process for sputter coating a substrate in a cathode sputtering apparatus having an alloy target, said process comprising
   selecting a target alloy having gold in a range of 90 to 98 percent by weight and aluminum in a range of 0.5 to 10 percent by weight, the balance comprising copper; and
   sputter coating said substrate with said alloy.

2. The process of claim 1 wherein said target alloy is chosen to produce a standard gold color in the substrate coating, said standard color coating being defined by CIELAB units of luster $L^*$ in a range of 85 to 90, redness $a^*$ in a range of 0.5 to 3, and yellowness $b^*$ in a range of 26 to 30.

3. The process of claim 11 wherein said target alloy is selected to have aluminum in a range of 0.5 to 5 percent by weight.

4. The process of claim 11 wherein said target alloy is selected to have gold in a range of 94 to 98 percent by weight.

5. The process of claim 11 wherein said target alloy is selected to have a balance consisting of copper.

6. The process of claim 11 wherein said target alloy is selected to have a balance consisting of copper and at least one additional alloy component selected from the group consisting of Co, Ni, Ga, Ti, In, Cd, Sn, Fe and Pd, each additional alloy component being present in said alloy in a range of 0.1 to 5 percent by weight, the total of said additional alloy components not exceeding 6 percent by weight.

7. A cathode sputtering apparatus comprising a target of an alloy having gold in a range of 90 to 98 percent by weight and aluminum in a range of 0.5 to 10 percent by weight, the balance comprising copper, whereby, a substrate placed in said apparatus may be sputter coated with said alloy.

8. Apparatus as in claim 7 wherein said target alloy is chosen to produce a standard gold color in the substrate coating, said standard color coating being defined by CIELAB units of luster $L^*$ in a range of 85 to 90, redness $a^*$ in a range of 0.5 to 3, and yellowness $b^*$ in a range of 26 to 30.

9. Apparatus as in claim 7 wherein said target alloy is selected to have aluminum in a range of 0.5 to 5 percent by weight.

10. Apparatus as in claim 7 wherein said target alloy is selected to have gold in a range of 94 to 98 percent by weight.

11. Apparatus as in claim 7 wherein said target alloy is selected to have a balance consisting of copper.

12. Apparatus as in claim 7 wherein said target alloy is selected to have a balance consisting of copper and at least one additional alloy component selected from the group consisting of Co, Ni, Ga, Ti, In, Cd, Sn, Fe and Pd, each additional alloy component being present in said alloy in a range of 0.1 to 5 percent by weight, the total of said additional alloy components not exceeding 6 percent by weight.

* * * * *